(12) United States Patent
Wu et al.

(10) Patent No.: US 12,349,445 B2
(45) Date of Patent: Jul. 1, 2025

(54) VERTICALLY INTEGRATED SEMICONDUCTOR DEVICE

(71) Applicant: INTERNATIONAL BUSINESS MACHINES CORPORATION, Armonk, NY (US)

(72) Inventors: Heng Wu, Guilderland, NY (US); Junli Wang, Slingerlands, NY (US); Teresa J. Wu, Rexford, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 17/648,817

(22) Filed: Jan. 25, 2022

(65) Prior Publication Data

US 2023/0238285 A1    Jul. 27, 2023

(51) Int. Cl.
| | |
|---|---|
| *H10D 84/03* | (2025.01) |
| *H01L 21/02* | (2006.01) |
| *H01L 23/50* | (2006.01) |
| *H01L 25/065* | (2023.01) |
| *H10B 41/20* | (2023.01) |

(Continued)

(52) U.S. Cl.
CPC ..... *H10D 84/038* (2025.01); *H01L 21/02532* (2013.01); *H01L 23/50* (2013.01); *H01L 25/0652* (2013.01); *H10B 41/20* (2023.02); *H10D 84/0167* (2025.01); *H10D 84/0186* (2025.01); *H10B 51/20* (2023.02)

(58) Field of Classification Search
CPC .... H10D 84/038; H10D 84/85; H10D 84/856; H10D 84/08; H10D 84/907; H10D 30/6741; H10D 87/00; H10D 88/00; H01L 21/02532; H01L 23/50
See application file for complete search history.

(56) References Cited

U.S. PATENT DOCUMENTS

| | | |
|---|---|---|
| 6,821,826 B1 | 11/2004 | Chan |
| 7,176,084 B2 | 2/2007 | Lee |
| 8,642,416 B2 | 2/2014 | Or-Bach |

(Continued)

FOREIGN PATENT DOCUMENTS

| | | |
|---|---|---|
| CN | 1610114 A | 4/2005 |
| WO | 0039853 A1 | 7/2000 |

OTHER PUBLICATIONS

Notification of Transmittal of the International Search Report and the Written Opinion of the International Searching Authority, or the Declaration, Date of mailing Mar. 14, 2023, Applicant's or agent's file reference F22W3269, International application No. PCT/CN2023/073247, 7 pages.

*Primary Examiner* — Ajay Ojha
*Assistant Examiner* — Sandra Milena Rodriguez Villanu
(74) *Attorney, Agent, or Firm* — Yuanmin Cai

(57) ABSTRACT

Embodiments of present invention provide a semiconductor device. The semiconductor device includes a silicon (Si) substrate containing a set of short channel field-effect-transistors (FETs); a germanium (Ge) layer on top of the Si substrate containing a set of long channel p-type FETs (PFETs); and an oxide semiconductor layer on top of the Ge layer containing a set of long channel n-type FETs (NFETs), wherein the set of short channel FETs, long channel PFETs, and long channel NFETs are interconnected through a set of far-back-end-of-line (FBEOL) layers.

18 Claims, 10 Drawing Sheets

(51) Int. Cl.
*H10B 51/20* (2023.01)
*H10D 84/01* (2025.01)

(56) References Cited

U.S. PATENT DOCUMENTS

| | | |
|---|---|---|
| 9,472,558 B1 | 10/2016 | Cheng |
| 9,576,858 B2 | 2/2017 | Cheng |
| 9,659,963 B2 | 5/2017 | Cheng |
| 10,475,815 B2 | 11/2019 | Lupino |
| 10,950,545 B2 | 3/2021 | Shao |
| 2006/0025102 A1 | 2/2006 | Kipnis |
| 2009/0230463 A1 | 9/2009 | Carter |
| 2016/0351975 A1* | 12/2016 | Momo .................. H10D 88/00 |
| 2018/0132056 A1 | 5/2018 | Leedy |
| 2018/0158739 A1* | 6/2018 | Liu ...................... H10D 86/011 |
| 2020/0066584 A1* | 2/2020 | Kao ..................... H10D 88/00 |
| 2022/0344402 A1* | 10/2022 | Wang ................... H10D 62/80 |

* cited by examiner

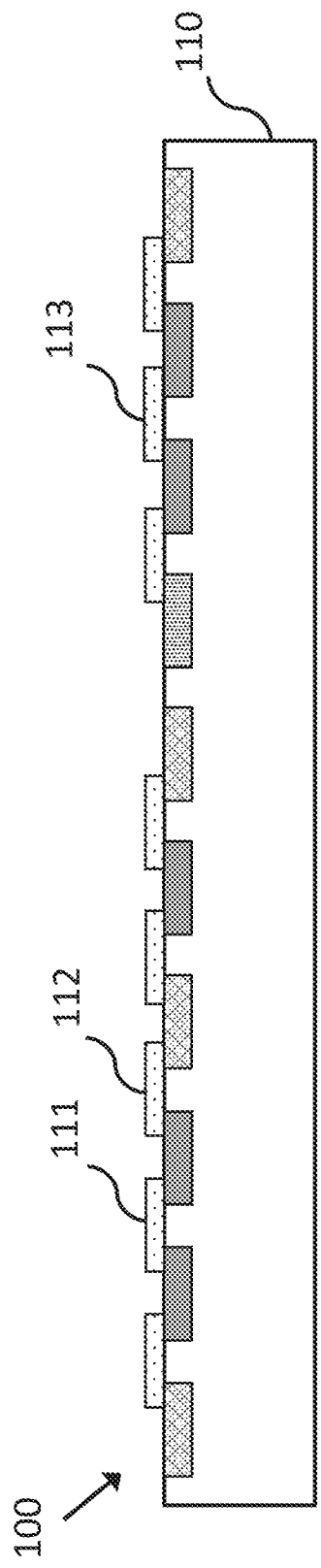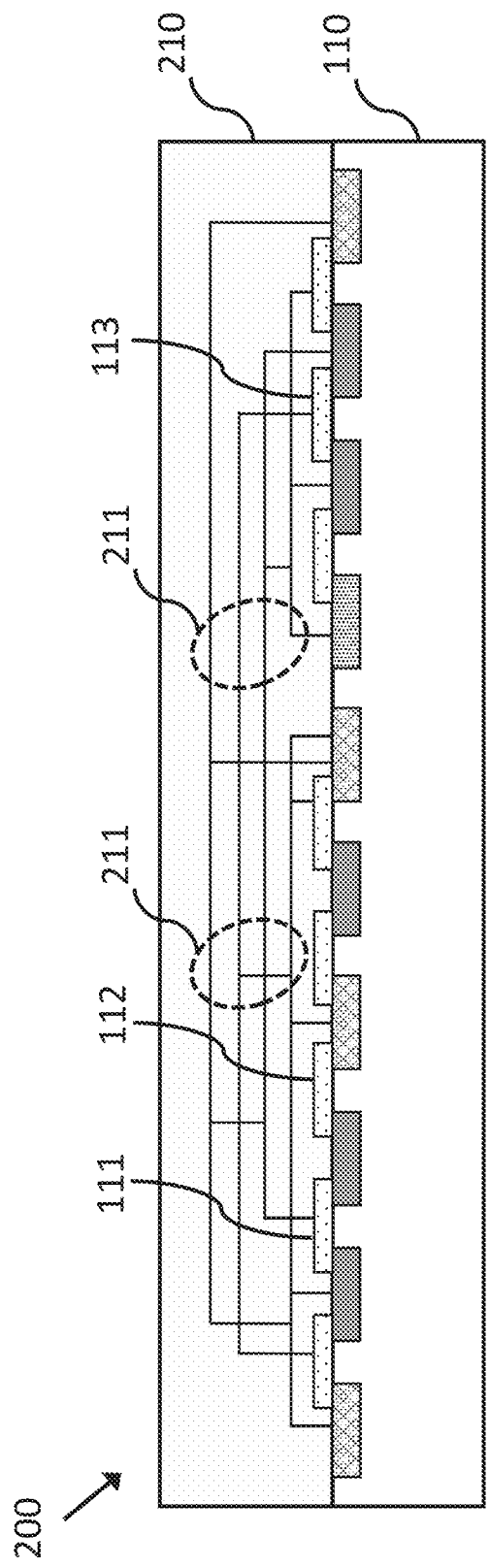

VERTICALLY INTEGRATED SEMICONDUCTOR DEVICE

FIELD OF THE INVENTION

The present application generally relates to manufacturing of semiconductor integrated circuits. More particularly, it relates to vertically integrated semiconductor device and method of manufacturing the same.

BACKGROUND

With the ever-increasing demand for high density of semiconductor devices, dimensions of various semiconductor devices and circuitries are shrinking dramatically. Generally, different devices shrink at different rates, often based upon their functionalities. For example, for semiconductor devices such as transistors whose size is fast reaching 3 nm and beyond, measured by their node size, short channel circuitry such as short channel logic transistors may be scaled by 1.8 times a regular rate (or a baseline rate). Comparatively, on the other hand, long channel circuitry such as long channel transistors that are more often used in input/output (IO) circuitry, analog circuitry and/or other peripheral devices may be scaled at a different rate due to performance constrain of these devices. For example, and more commonly, long channel circuitry may be scaled at 1.1 times the regular rate.

The difference or discrepancy in scaling rate among devices of different functionalities presents a challenging problem for device integration. For example, integration of long channel and short channel devices at a same device level requires complex integration flow, which has often led to overall yield degradation and much higher cost. On the other hand, even though there are technologies that are trying to integrate transistors through vertically stacking them together, problems such as thermal impact from top transistors onto transistors at the bottom have yet to be resolved.

SUMMARY

Embodiments of present invention provide a vertically integrated semiconductor device wherein short channel circuitry and long channel circuitry are separately formed in different device layers. Embodiments of present invention also provide a method of separately forming short channel transistors or devices, such as logic transistors, from long channel transistors or devices, such as those used in input/output (I/O) devices, analog devices, and other peripheral devices in different device layers. Moreover, embodiments of present invention provide a method of forming p-type long channel transistors and n-type long channel transistors in separate device layers. After the formation of the standard short channel circuitry or devices in the Si substrate, process of forming long channel circuitry or devices may be controlled at low temperature levels, thereby without impacting existing short channel circuitry underneath.

More specifically, embodiment of present invention provides a semiconductor device. The semiconductor device includes a single crystalline silicon (Si) substrate containing a first set of transistors; a germanium (Ge) on top of the Si substrate containing a second set of transistors; and an oxide semiconductor layer on top of the Si substrate containing a third set of transistors. In one embodiment, the first set of transistors are short channel (SC) transistors, the second set of transistors are p-type long channel (LC) transistors, and the third set of transistors are n-type LC transistors. In another embodiment, the third set of transistors in the oxide semiconductor layer are on top of the second set of transistors in the Ge layer. In yet another embodiment, the oxide semiconductor layer is either an indium tin oxide (ITO) layer or an indium gallium zinc oxide (IGZO) layer.

According to one embodiment, the Si substrate is covered by a first set of back-end-of-line (BEOL) layers providing local interconnect for the first set of transistors, and wherein the Ge layer is formed directly on top of the first set of BEOL layers through a low temperature wafer bonding process. In one embodiment, the Ge layer is covered by a second set of BEOL layers providing local interconnect for the second set of transistors, and wherein the oxide semiconductor layer is formed directly on top of the second set of BEOL layers through a low temperature physical vapor deposition (LTPVD) process or a low temperature chemical vapor deposition (LTCVD) process. In yet another embodiment, the oxide semiconductor layer is covered by a third set of BEOL layers providing local interconnect for the third set of transistors and providing interconnect between the second and third sets of transistors.

According to another embodiment, the third set of BEOL layers is covered by a set of far-back-end-of-line (FBEOL) layers providing interconnect among the first set of transistors, the second set of transistors, and the third set of transistors. Moreover, the Ge layer and the oxide semiconductor layer each contains one or more analog devices, input/output (I/O) devices, or peripheral devices.

Embodiments of present invention further provide a method of manufacturing a semiconductor device. The method includes forming a first set of transistors in a single crystalline silicon (Si) substrate; forming a second set of transistors in a germanium (Ge) layer above the Si substrate; and forming a third set of transistors in an oxide semiconductor layer above the Si substrate. In one embodiment, the first set of transistors are a set of short channel (SC) transistors, the second set of transistors are a set of p-type long channel (LC) transistors, and the third set of transistors are a set of n-type LC transistors.

According to one embodiment, the method further includes forming a first set of back-end-of-line (BEOL) layers above the set of SC transistors in the Si substrate; forming a second set of BEOL layers above the set of p-type LC transistors in the Ge layer; and forming a third set of BEOL layers above the set of n-type LC transistors.

BRIEF DESCRIPTION OF THE DRAWINGS

The present invention will be understood and appreciated more fully from the following detailed description of embodiments of present invention, taken in conjunction with accompanying drawings of which:

FIG. 1 is a demonstrative illustration of cross-sectional view of a semiconductor device in a step of manufacturing thereof in accordance with one embodiment of present invention;

FIG. 2 is a demonstrative illustration of cross-sectional view of a semiconductor device in a step of manufacturing thereof, following the step illustrated in FIG. 1, in accordance with one embodiment of present invention;

Figure 3:
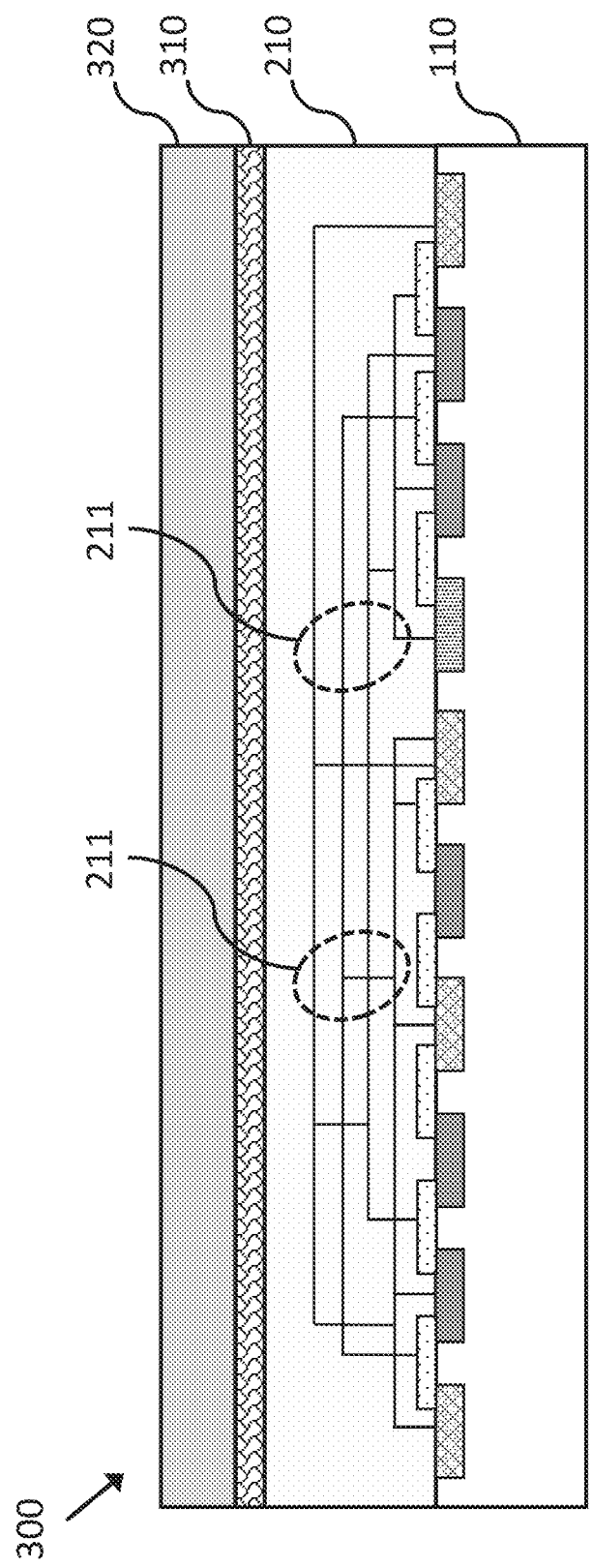
FIG. 3 is a demonstrative illustration of cross-sectional view of a semiconductor device in a step of manufacturing thereof, following the step illustrated in FIG. 2, in accordance with one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION OF PREFERRED EMBODIMENTS

In the below detailed description and the accompanying drawings, it is to be understood that various layers, structures, and regions shown in the drawings are both demonstrative and schematic illustrations that are not drawn to scale. In addition, for the ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures may not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

FIGS. 1 through 9 are demonstrative illustrations of cross-sectional views of a semiconductor device during a process of manufacturing thereof in accordance with one or more embodiments of present invention. Particularly, the semiconductor device may be a vertically integrated semiconductor device, and more particularly may be a semiconductor device functionally integrated in a vertical direction.

Reference is made to FIG. 1, which demonstratively illustrates a semiconductor structure 100 in a step of manufacturing a semiconductor device according to one embodiment of present invention. More specifically, semiconductor structure 100 may include a semiconductor substrate 110 and a first set of transistors such as, for example, transistors 111, 112, and 113 on top of or inside semiconductor substrate 110.

Substrate 110 may be a bulk single crystalline silicon (Si) substrate. However, embodiments of present invention are not limited in this aspect and other types of semiconductor substrates may also be used. These substrates may include, for example, bulk germanium (Ge) substrate, silicon-germanium (SiGe) substrate, silicon-on-isolation (SOI) substrate, and other currently existing or future developed substrates. Hereinafter, for the ease of discussion without loss of generality, substrate 110 may be referred to as a Si substrate.

In one aspect, the embodiment provides forming first set of transistors 111, 112, and 113 on top of or inside substrate 110. Here, as being illustrated in FIG. 1 (and in subsequent drawings for other transistors, devices, and elements), transistors 111, 112, and 113 are only schematically illustrated without their specific details such as their source/drain and gate structures. This does not explicitly mean or in any way imply that such structures do not exist in the actual device. Rather, the omission of these specific details will not obscure description of embodiment of present invention.

First set of transistors 111, 112, and 113 may be, for example, logic transistors based on their functionality and may be either p-type or n-type. First set of transistors 111, 112, and 113 may be highly scaled short channel (SC) transistors, and may be manufactured using one or more front-end-of-line (FEOL) processes. Here, the term "transistors" are generally used in referring to field-effect-transistors (FETs), which may include, but are not limited to, planar transistors, fin-type transistors, vertical transistors, nanosheet transistors, nanowire transistors, gate-all-around (GAA) transistors, or any other currently existing or future developed transistors. In addition, "short channel" transistors refer to transistors that have a gate length, from source to drain, that is relatively short. This is in comparison with transistors that have a relatively long gate length from source to drain and are referred to as "long channel" transistors, which are described below in more details with reference to FIG. 4 and FIG. 7. Generally short channel transistors or devices are standard logic transistors or devices with a gate length less than, for example, 100 nm and a low drive voltage of, for example, less than 1.5 volts. On the other hand, long channel transistors or devices typically have a gate length longer than 100 nm and have a high drive voltage of, for example, around 2 to 3 volts.

According to embodiment of present invention, only short channel transistors are formed in or on substrate 110. Short channel transistors are generally used as, for example, logic transistors. In other words, no long channel (LC) transistors are formed in or on substrate 110. Long channel transistors are generally used for analog devices, input/output (I/O) devices, and/or peripheral devices, and according to embodiment of present invention, are moved to one or more device layers different from the device layer for short channel transistors as being described below in more details with reference to FIG. 4 to FIG. 7.

By separating SC transistors and LC transistors into different device layers, which otherwise would require a complicated integration flow to be fabricated on a same device layer, embodiments of present invention provide a semiconductor device manufacturing process that is less complicated, resulting in improved yield of devices.

Reference is made to FIG. 2, which demonstratively illustrates a semiconductor structure 200 in a step, following the step illustrated in FIG. 1, of manufacturing a semiconductor device according to one embodiment of present invention. More specifically, the embodiment provides forming a first set of back-end-of-line (BEOL) layers 210 on top of substrate 110. The first set of BEOL layers 210 may include local interconnect 211 that provides connectivity among SC transistors 111, 112, and 113 to enable functionality of SC transistors 111, 112, and 113 as, for example, logic circuitry. The embodiment also provides planarizing a top surface of the first set of BEOL layers 210.

Reference is made to FIG. 3, which demonstratively illustrates a semiconductor structure 300 in a step, following the step illustrated in FIG. 2, of manufacturing a semiconductor device according to one embodiment of present invention. More specifically, the embodiment provides wafer bonding a germanium (Ge) wafer to Si substrate 110.

For example, the embodiment provides bonding a Ge wafer to the top surface of the first set of BEOL layers 210 through a bonding agent 310. The Ge wafer bonding process is a low temperature process, with its thermal budget being within a limit that will not affect performance of devices underneath thereof. For example, the bonding process is generally performed around a temperature range between room temperature around 25° C. (degrees Celsius) and 300° C., such that device performance of the first set of transistors, for example SC transistors 111, 112, and 113, will not be affected. After the low temperature wafer bonding process, the Ge wafer may be thinned down in thickness, for example, through a chemical-mechanical-polishing (CMP) process. For example, the Ge wafer may be polished down to a Ge layer 320 that may have a thickness of less than 100 nm, preferably between 30 to 60 nm, and more preferably around 40 nm.

Herein, Ge layer 320 is formed on top of Si substrate 110 in preparation of forming p-type LC transistors thereupon, as being described below in more details. However, embodiment of present invention is not limited in this aspect. For example, another type of material layer such as an oxide semiconductor layer may be formed, instead of a Ge layer, on top of Si substrate 110 such that n-type LC transistors may be formed thereupon. Hereinafter, for the ease of description without loss of generality, it is assumed Ge layer 320 is formed on top of Si substrate 110 and more specifically on top of first set of BEOL layers 210.

Figure 4:
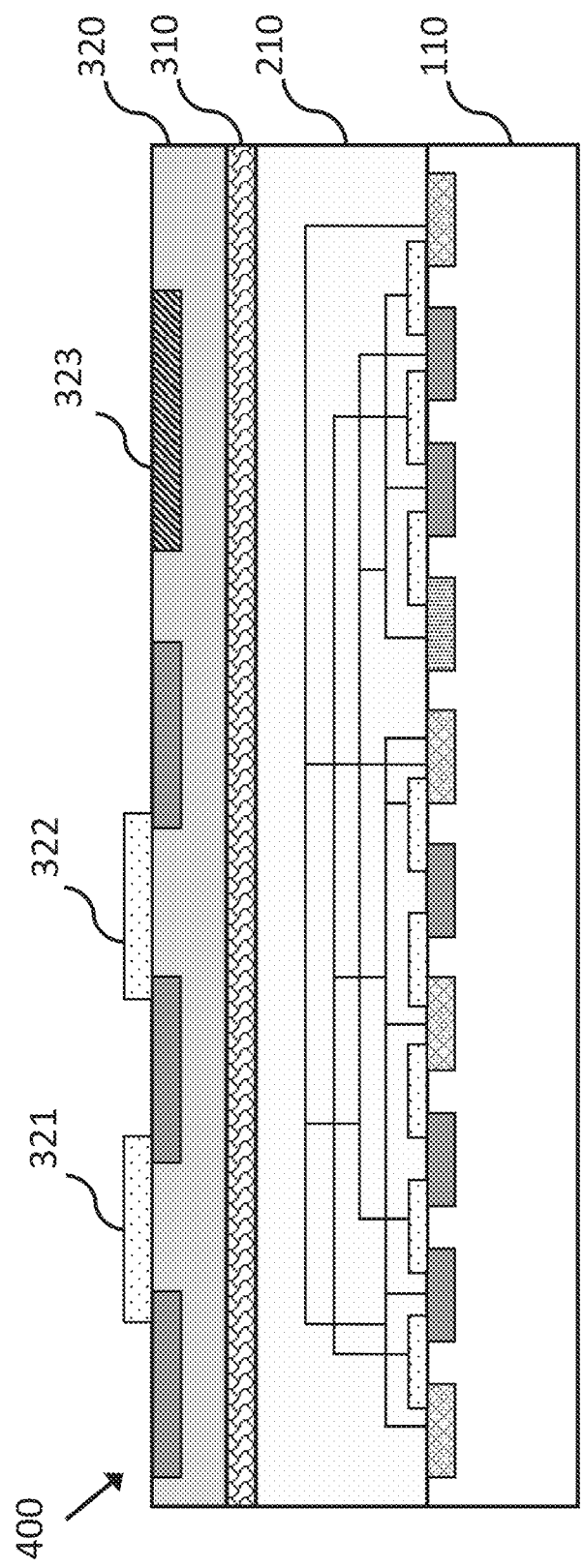
FIG. 4 is a demonstrative illustration of cross-sectional view of a semiconductor device in a step of manufacturing thereof, following the step illustrated in FIG. 3, in accordance with one embodiment of present invention.

Reference is made to FIG. 4, which demonstratively illustrates a semiconductor structure 400 in a step, following the step illustrated in FIG. 3, of manufacturing a semiconductor device according to one embodiment of present invention. More specifically, the embodiment provides forming a second set of transistors, for example transistors used in analog devices, I/O devices, or peripheral devices, on Ge layer 320. The second set of transistors such as transistors 321 and 322 may be LC transistors, and more specifically may be p-type LC transistors, and furthermore specifically may be p-type LC field-effect-transistors (FETs).

Forming p-type LC transistors 321 and 322 may generally require a different integration flow from that for forming SC transistors 111, 112, and 113. By forming p-type LC transistors 321 and 322 on Ge layer 320, instead of on Si substrate 110, embodiments of present invention provide a method of forming a semiconductor device with greatly reduced complexity. In other words, embodiments of present invention provide a method that integrates different types of transistors vertically according to their functionality, structures, or a combination of both. For example, the integration process may be made based upon device structures such as whether transistors are LC transistors or SC transistors, or based upon device functionality such as whether transistors are used for logic circuitry or for analog, I/O, or other peripherical devices. The integration process may further be made based upon whether the transistors are p-type LC transistors or n-type LC transistors. More specifically, in the case of n-type LC transistors, n-type LC transistors may be made in another device layer different from Ge layer 320 and from Si substrate 110, as being described below in more details with reference to FIG. 7.

In one aspect, the embodiment further provides forming one or more passive devices such as passive device 323 on Ge layer 320.

Figure 5:
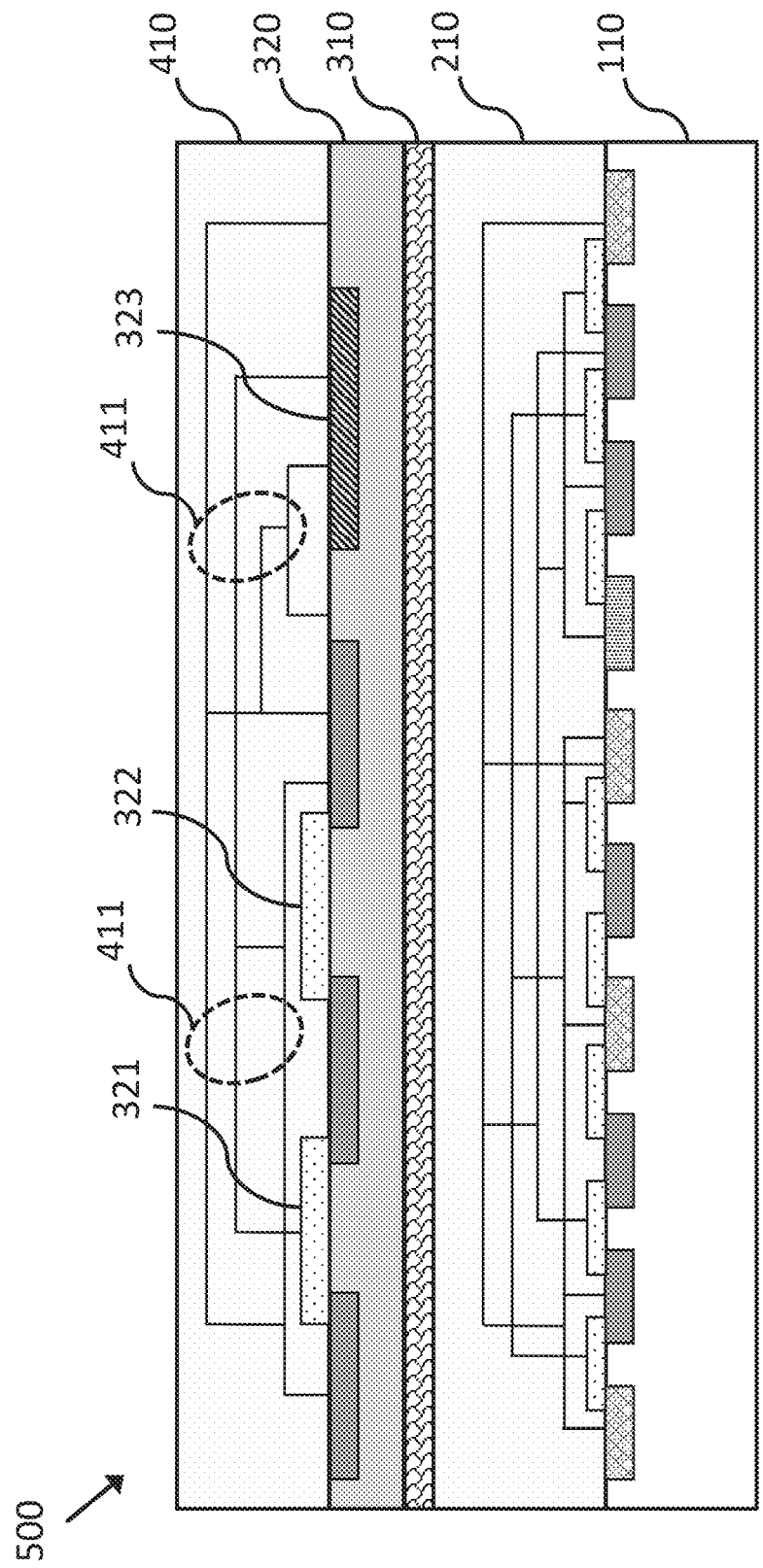
FIG. 5 is a demonstrative illustration of cross-sectional view of a semiconductor device in a step of manufacturing thereof, following the step illustrated in FIG. 4, in accordance with one embodiment of present invention.

Reference is made to FIG. 5, which demonstratively illustrates a semiconductor structure 500 in a step, following the step illustrated in FIG. 4, of manufacturing a semiconductor device according to one embodiment of present invention. More specifically, as with the first set of BEOL layers, the embodiment provides forming a second set of BEOL layers 410 on top of Ge layer 320. Second set of BEOL layers 410 may include local interconnect 411 that provides connectivity among p-type LC transistors 321 and 322, as well as passive devices such as passive device 323 to enable functionality of p-type LC transistors 321 and 322. P-type LC transistors 321 and 322, for example, may work as analog devices, I/O devices, and/or peripheral device together or not with n-type LC transistors 511 and 512, for example, as being described below in more details with reference to FIGS. 7-8.

Figure 6:
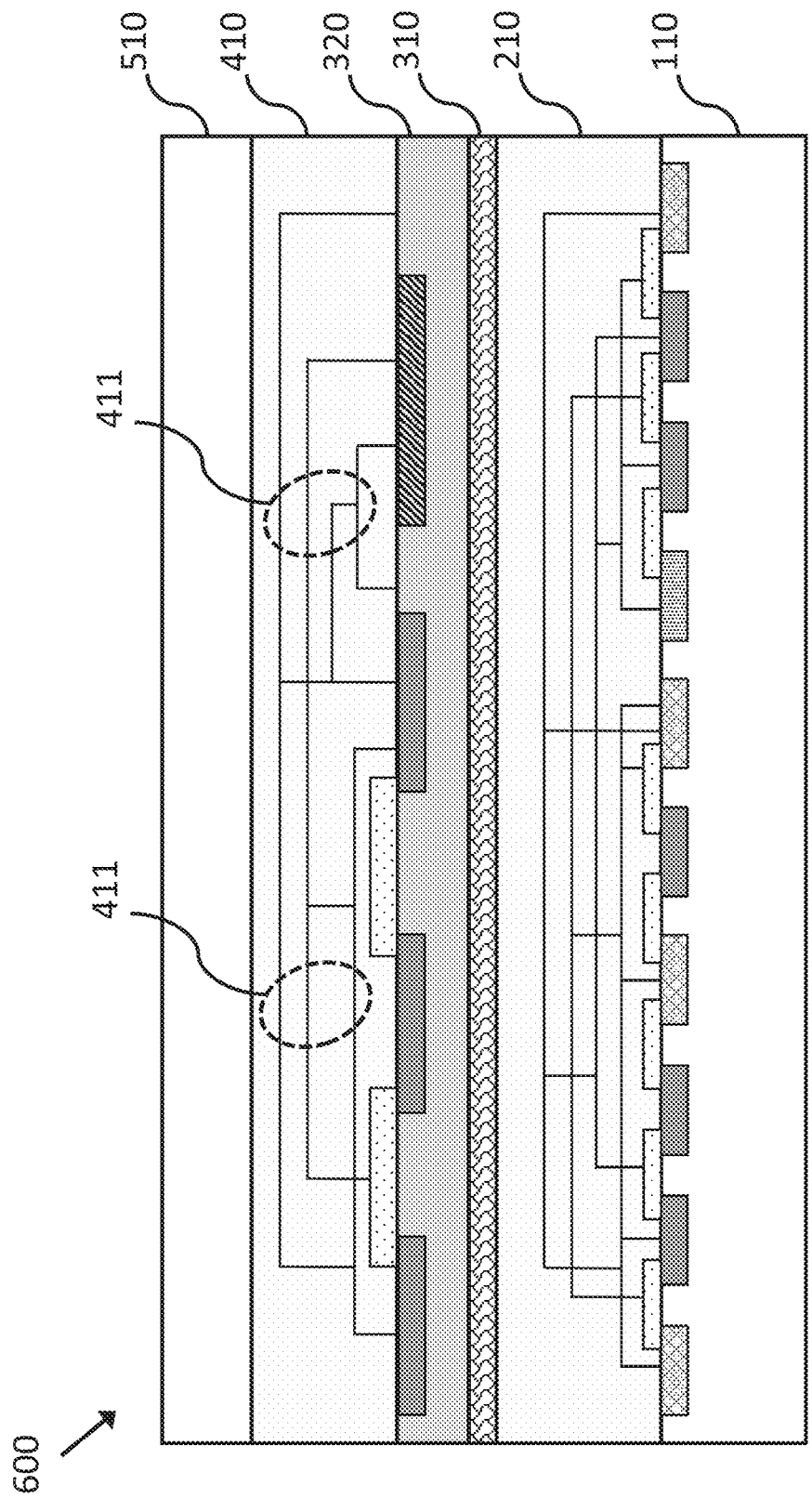
FIG. 6 is a demonstrative illustration of cross-sectional view of a semiconductor device in a step of manufacturing thereof, following the step illustrated in FIG. 5, in accordance with one embodiment of present invention.

Reference is made to FIG. 6, which demonstratively illustrates a semiconductor structure 600 in a step, following the step illustrated in FIG. 5, of manufacturing a semiconductor device according to one embodiment of present invention. More specifically, the embodiment provides forming a semiconductor material layer that is suitable for forming n-type LC transistors therein. For example, the embodiment provides forming an oxide semiconductor layer 510 on top of Si substrate 110 and more specifically directly on top of second set of BEOL layers 410. In one embodiment, oxide semiconductor layer 510 may be an indium tin oxide (ITO) layer. In another embodiment, oxide semiconductor layer 510 may be an indium gallium zinc oxide (IGZO) layer. However, embodiments of present invention are not limited in this aspect and oxide semiconductor layer of other types of material, particularly those that are suitable for n-type LC transistors, may be used.

It is to be noted here, according to one embodiment of present invention, that oxide semiconductor layer 510 may be formed first on top of Si substrate 110 and Ge layer 320 may then be formed on top of oxide semiconductor layer 510. In other words, the order of forming n-type LC transistors in an oxide semiconductor layer and forming p-type LC transistors in a Ge layer may be reversed. Ge layer 320, via bonding agent 310, may be formed on top of oxide semiconductor layer 510. A semiconductor device 900' formed thereby, using process steps that are similar to those to be described below, is described in more details with reference to FIG. 10, which demonstratively illustrates semiconductor device 900'.

In one embodiment, oxide semiconductor layer 510 may be formed through a low temperature deposition process. For example, a low temperature physical vapor deposition (LPPVD) process or a low temperature chemical vapor deposition (LPCVD) process may be used to form oxide semiconductor layer 510. Thermal budget of the deposition process may be sufficiently low, typically in a temperature range between about 100 and 400° C. During the deposition of oxide semiconductor layer 510, performance of p-type LC transistors in Ge layer 320 and SC transistors 111, 112, and 113 in Si substrate 110 may not be compromised or impacted.

Figure 7:
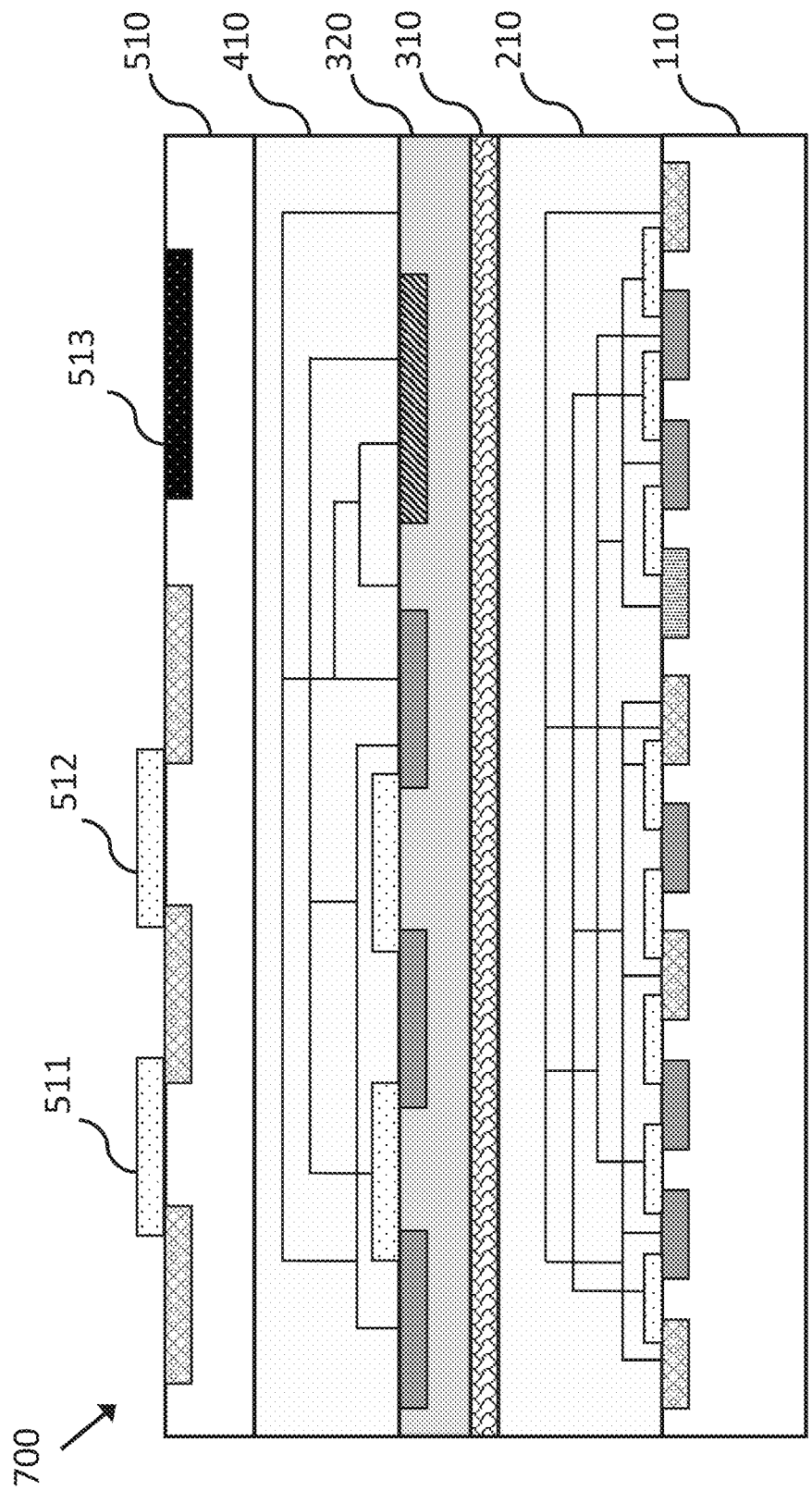
FIG. 7 is a demonstrative illustration of cross-sectional view of a semiconductor device in a step of manufacturing thereof, following the step illustrated in FIG. 6, in accordance with one embodiment of present invention.

Reference is made to FIG. 7, which demonstratively illustrates a semiconductor structure 700 in a step, following the step illustrated in FIG. 6, of manufacturing a semiconductor device according to one embodiment of present invention. More specifically, as with the second set of transistors, the embodiment provides forming a third set of transistors, for example transistors used in analog devices, I/O devices, or peripheral devices on oxide semiconductor layer 510. The third set of transistors such as transistors 511 and 512 may be LC transistors, and more specifically may be n-type LC transistors, and furthermore specifically may be n-type LC FETs.

Like forming p-type LC transistors 321 and 322, forming LC transistors 511 and 512 may generally require a different integration flow from that for forming SC transistors 111, 112, and 113. By forming n-type LC transistors 511 and 512, together with p-type LC transistors 321 and 322, on oxide semiconductor layer 510 and Ge layer 320 separately and respectively, embodiment of present invention provides a method of forming a semiconductor device with greatly reduced complexity. In other words, embodiment of present invention provides a method that vertically integrates different types of transistors according to their functionality and/or structures. For example, the integration may be made based upon device structures, whether LC or SC transistors, or functionality whether the transistors are for logic device or circuitry or for analog device, I/O devices, and other peripherical devices or their related circuitries. The integration may be made further based upon whether the LC transistors are p-type or n-type transistors. In one aspect, the embodiment further provides forming one or more passive devices such as passive device 513 on oxide semiconductor layer 510.

Figure 8:
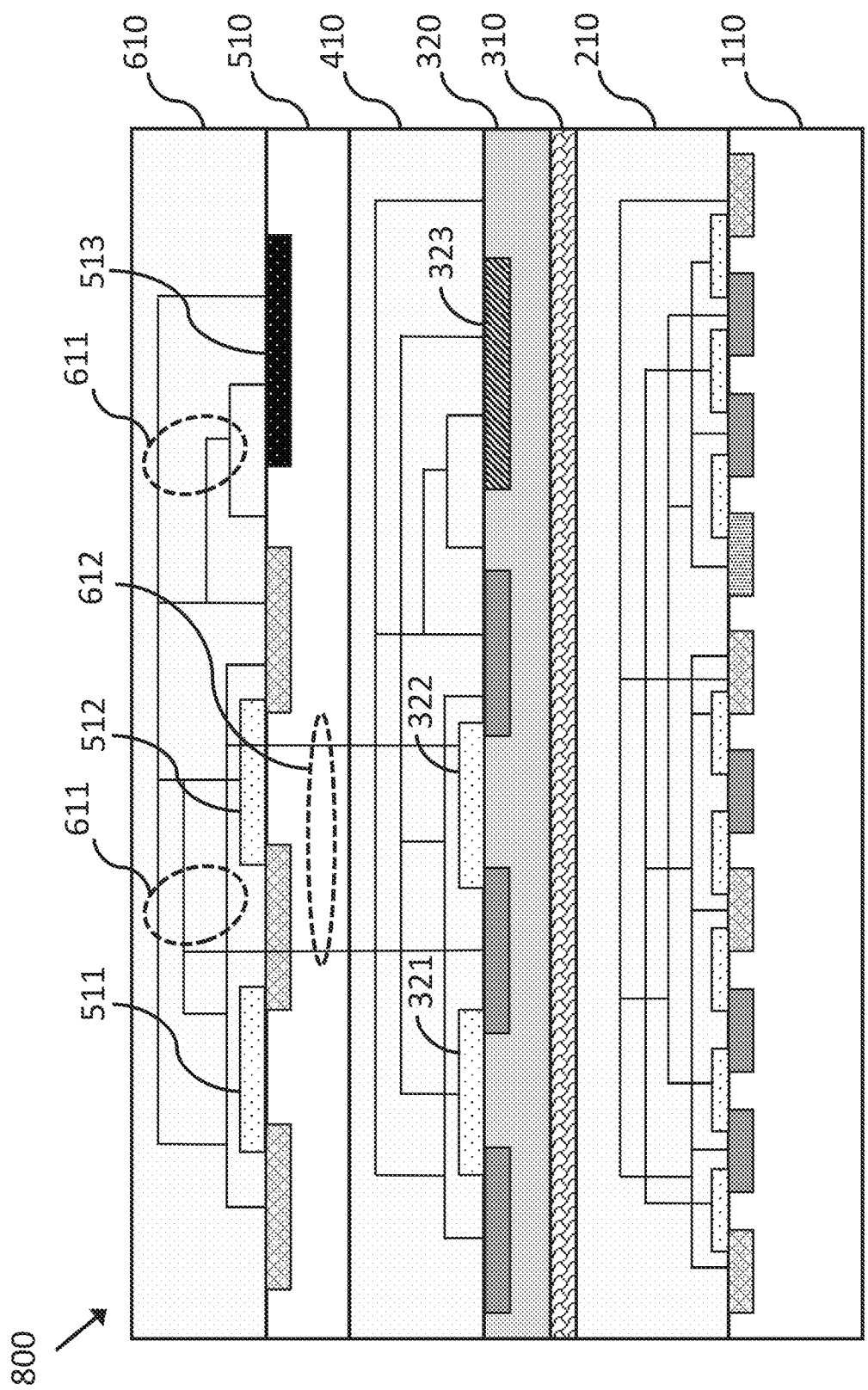
FIG. 8 is a demonstrative illustration of cross-sectional view of a semiconductor device in a step of manufacturing thereof, following the step illustrated in FIG. 7, in accordance with one embodiment of present invention.

Reference is made to FIG. 8, which demonstratively illustrates a semiconductor structure 800 in a step, following the step illustrated in FIG. 7, of manufacturing a semiconductor device according to one embodiment of present invention. More specifically, as with the first and second sets of BEOL layers, the embodiment provides forming a third set of BEOL layers 610 on top of oxide semiconductor layer 510. Third set of BEOL layers 610 may include local interconnect 611 that provides connectivity among n-type LC transistors 511 and 512, as well as passive devices such as passive device 513, to enable functionality of n-type LC transistors 511 and 512. Third set of BEOL layers 610 may additionally include interconnect 612 that provides interconnectivity among p-type LC transistors 321 and 322 in Ge layer 320 and n-type LC transistors 511 and 512 in oxide semiconductor layer 510. P-type LC transistors such as p-type LC transistors 321 and 322 and n-type LC transistors such as n-type LC transistors 511 and 512, together or separately, may provide functionality of, for example, analog devices, I/O devices, and/or other peripheral devices.

Figure 9:
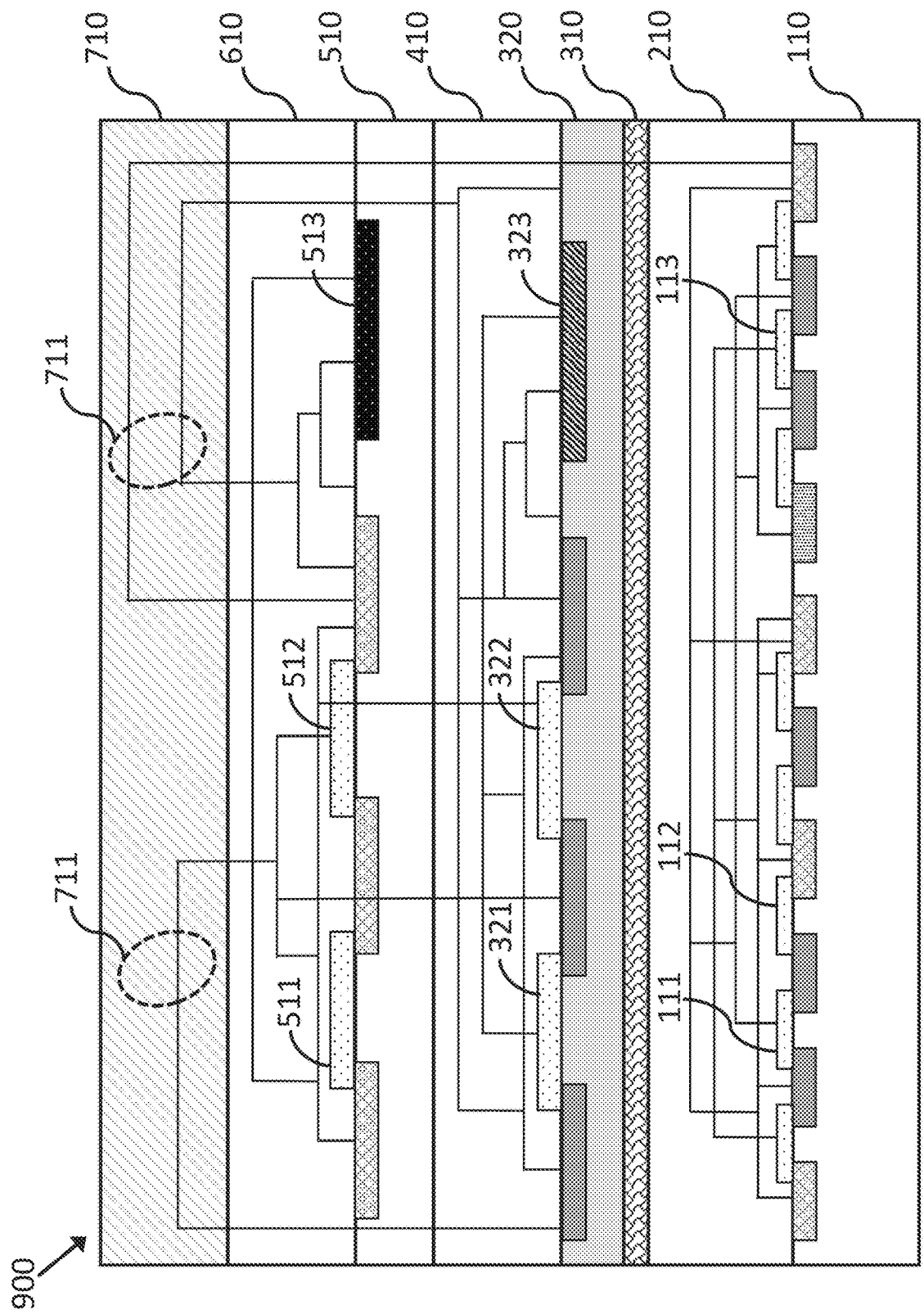
FIG. 9 is a demonstrative illustration of cross-sectional view of a semiconductor device in a step of manufacturing thereof, following the step illustrated in FIG. 8, in accordance with one embodiment of present invention.

Reference is made to FIG. 9, which demonstratively illustrates a semiconductor structure 900 in a step, following the step illustrated in FIG. 8, of manufacturing a semiconductor device according to one embodiment of present invention. More specifically, following the formation of n-type LC transistors in oxide semiconductor layer 510 and the third set of BEOL layers 610, the embodiment provides forming a set of far-back-end-of-line (FBEOL) layers 710. The set of FBEOL layers 710 may include interconnect 711 that provides interconnectivity among SC transistors such as SC transistors 111, 112, and 113 in Si substrate 110, p-type LC transistors such as p-type LC transistors 321 and 322 in Ge layer 320, and n-type LC transistors such as n-type LC transistors 511 and 512 in oxide semiconductor layer 510.

Embodiments of present invention provide a semiconductor structure or device 900 that includes vertically integrated functional circuitries. For example, SC transistors that may serve as logic transistors are provided in a lower Si substrate layer; p-type LC transistors that, together with n-type LC transistors, may serve as analog devices, I/O devices, or peripheral devices are provided in a middle Ge layer; and n-type LC transistors that, together with p-type LC transistors, may serve as analog devices, I/O devices, or peripheral devices are provided in an upper oxide semiconductor layer.

Figure 10:
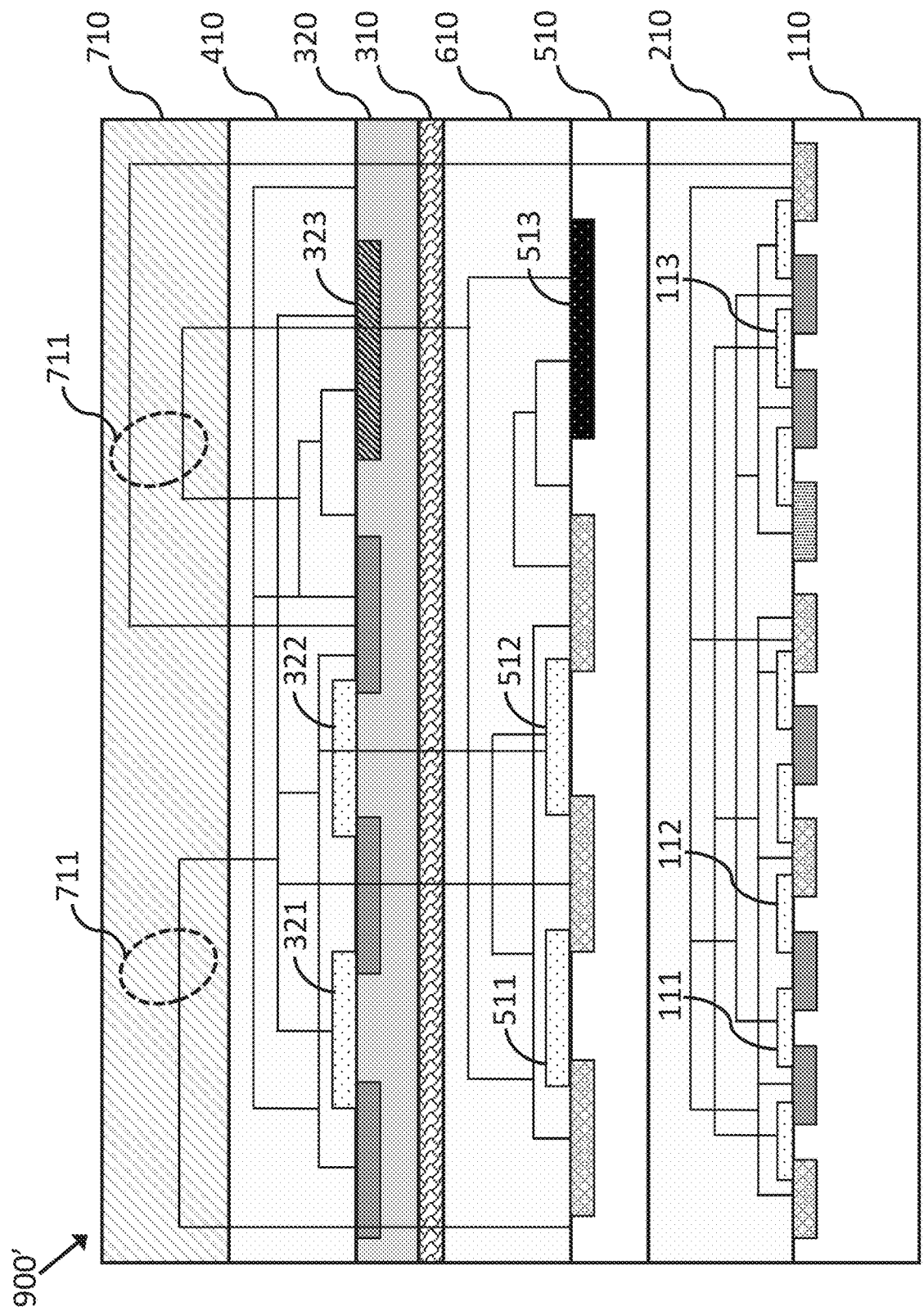
FIG. 10 is a demonstrative illustration of cross-sectional view of a semiconductor device in accordance with another embodiment of present invention.

FIG. 10 is a demonstrative illustration of cross-sectional view of a semiconductor device in accordance with another embodiment of present invention. More specifically, embodiment of present invention provides a semiconductor device 900' and method of manufacturing thereof as being similar to those steps described above. In particular, instead of forming Ge layer 320, oxide semiconductor layer 510 is formed on top of Si substrate 110 first. Third set of BEOL layers 610 is then formed on top of oxide semiconductor layer 510 to provide connectivity among n-type LC transistors 511, 512 and passive device 513. Next, Ge layer 320 is formed on top of third set of BEOL layers 610 using a bonding agent 310 to bond a Ge wafer to third set of BEOL layer 610 and subsequently thinning down the Ge wafer to become Ge layer 320. Second set of BEOL layers 410 is then formed on top of Ge layer 320 to provide connectivity among p-type LC transistors 321, 322 and passive device 323, and additionally interconnectivity among p-type LC transistors 321, 322 in Ge layer 320 and n-type LC transistors 511 and 512 in oxide semiconductor layer 510. As being the same as semiconductor device 900, FBEOL layer 710 is formed on top of second set of BEOL layer 410. The FBEOL layer 710 may include interconnects to provide interconnectivity among SC transistors 111, 112, and 113, n-type LC transistors 511 and 512, and p-type transistors 321 and 322.

Figure 11:
FIG. 11 is a demonstrative illustration of a flow-chart of a method of manufacturing a semiconductor device in accordance with embodiments of present invention.

FIG. 11 is a demonstrative illustration of a flow-chart of a method of manufacturing a semiconductor device in accordance with embodiments of present invention. More specifically, embodiments of present invention provide a method that provides (step 1010) forming SC transistors in a Si substrate. In one embodiment, exclusively only SC transistors that are generally used as logic transistors are formed in the Si substrate. In other words, other types of transistors such as LC transistors that are used in, for example analog devices, are formed in different device layers and not in the Si substrate. Forming exclusively SC transistors in the Si substrate greatly reduces the complexity of forming both SC and LC transistors on a same substrate. This is because SC transistors and LC transistors, with their different functionalities, often require different integration process flow which becomes increasingly difficult to accommodate with the continuous shrinking in the dimension of devices. The method further provides (step 1020) forming a first set of BEOL layers on top of the Si substrate. The first set of BEOL layers includes local interconnect to provide connectivity thereby enabling functionalities of the SC transistors. A top surface of the first set of BEOL layers may then be planarized.

Embodiment of present invention further provides forming a first material layer on top of the Si substrate that is suitable for forming p-type LC transistors. However, embodiments of present invention are not limited in this aspect. Another embodiment of present invention may provide forming a first material layer on top of the Si substrate that is suitable for forming n-type LC transistors instead of for forming p-type LC transistors.

More specifically, the method provides (step 1030) wafer bonding a Ge wafer to the Si substrate at the top surface of the first set of BEOL layers. The wafer bonding process may use a bonding agent and may be performed at a temperature range whose thermal budget may not impact device performance of SC transistors in the underneath Si substrate. The method then provides thinning down the thickness of Ge wafer to form a Ge layer. The method further provides (step 1040) forming a first set of LC transistors which may be p-type LC transistors in the Ge layer. Following the formation of the p-type LC transistors, the method provides (step 1050) forming a second set of BEOL layers on top of the Ge layer. The second set of BEOL layers may include local interconnect to provide connectivity to and among the p-type LC transistors in the Ge layer.

Embodiment of the method further provides forming a second material layer on top of the Ge layer that is suitable for n-type long channel transistors. More specifically, the method provides (step 1060) forming an oxide semiconductor layer on top of the Ge layer through a low temperature deposition process such as a LPPVD or LPCVD process. The oxide semiconductor layer may be either an indium tin oxide (ITO) layer, an indium gallium zinc oxide (IGZO) layer, or any other suitable semiconductor materials. Because it is a low temperature deposition process, the LPPVD or LPCVD process may not impact device performance of the p-type LC transistors in the Ge layer and the SC transistors in the Si substrate. The method then provides (step 1070) forming a second set of LC transistors which may be n-type LC transistors in the oxide semiconductor layer. Following the formation of the n-type LC transistors, the method provides (step 1080) forming a third set of BEOL layers on top of the oxide semiconductor layer. The third set of BEOL layers may include local interconnect to provide connectivity to and among the n-type LC transistors. The third set of BEOL layers may further include interconnect that provides interconnectivity between the p-type LC transistors in the Ge layer and the n-type LC transistors in the oxide semiconductor layer.

Furthermore, the method provides (step 1090) forming a set of FBEOL layers on top of the third set of BEOL layers. The set of FBEOL layers may include interconnect structures may be made to provide interconnectivities among the SC transistors in the Si substrate, p-type LC transistors in the Ge layer, and n-type LC transistors in the oxide semiconductor layer.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While certain features of the invention have been illustrated and described herein, many modifications, substitutions, changes, and equivalents will now occur to those of ordinary skill in the art. Such changes, modification, and/or alternative embodiments may be made without departing from the spirit of present invention and are hereby all considered within the scope of present invention. It is, therefore, to be understood that the appended claims are intended to cover all such modifications and changes as fall within the spirit of the invention.

What is claimed is:

1. A semiconductor device comprising:
a single crystalline silicon (Si) substrate containing a first set of transistors;
a germanium (Ge) layer on top of the Si substrate containing a second set of transistors; and
an oxide semiconductor layer on top of the Si substrate containing a third set of transistors,
wherein the first set of transistors are short channel (SC) transistors, the second set of transistors are p-type long channel (LC) transistors, and the third set of transistors are n-type LC transistors.

2. The semiconductor device of claim 1, wherein the third set of transistors in the oxide semiconductor layer are on top of the second set of transistors in the Ge layer.

3. The semiconductor device of claim 1, wherein the oxide semiconductor layer is either an indium tin oxide (ITO) layer or an indium gallium zinc oxide (IGZO) layer.

4. The semiconductor device of claim 1, wherein the Si substrate is covered by a first set of back-end-of-line (BEOL) layers providing local interconnect for the first set of transistors, and wherein the Ge layer is formed directly on top of the first set of BEOL layers through a low temperature wafer bonding process.

5. The semiconductor device of claim 4, wherein the Ge layer is covered by a second set of BEOL layers providing local interconnect for the second set of transistors, and wherein the oxide semiconductor layer is formed directly on top of the second set of BEOL layers through a low temperature physical vapor deposition (LTPVD) process or a low temperature chemical vapor deposition (LTCVD) process.

6. The semiconductor device of claim 5, wherein the oxide semiconductor layer is covered by a third set of BEOL layers providing local interconnect for the third set of transistors and providing interconnect between the second and third sets of transistors.

7. The semiconductor device of claim 6, wherein the third set of BEOL layers is covered by a set of far-back-end-of-line (FBEOL) layers providing interconnect among the first set of transistors, the second set of transistors, and the third set of transistors.

8. The semiconductor device of claim 1, wherein the Ge layer and the oxide semiconductor layer each contains one or more analog devices, input/output (I/O) devices, or peripheral devices.

9. A method of forming a semiconductor device comprising:
forming a first set of transistors in a single crystalline silicon (Si) substrate;
forming a second set of transistors in a germanium (Ge) layer above the Si substrate; and
forming a third set of transistors in an oxide semiconductor layer above the Si substrate,
wherein the first set of transistors are a set of short channel (SC) transistors, the second set of transistors are a set of p-type long channel (LC) transistors, and the third set of transistors are a set of n-type LC transistors.

10. The method of claim 9, further comprising forming a first set of back-end-of-line (BEOL) layers above the set of SC transistors in the Si substrate; forming a second set of BEOL layers above the set of p-type LC transistors in the Ge layer; and forming a third set of BEOL layers above the set of n-type LC transistors.

11. The method of claim 10, wherein forming the first set of BEOL layers comprises forming local interconnect for the set of SC transistors; forming the second set of BEOL layers comprises forming local interconnect for the set of p-type LC transistors; and forming the third set of BEOL layers comprises forming local interconnect for the set of n-type LC transistors and forming interconnect between the set of p-type LC transistors and the set of n-type LC transistors.

12. The method of claim 9, further comprising forming a set of far-back-end-of-line (FBEOL) layers providing interconnect among the first set of transistors, the second set of transistors, and the third set of transistors.

13. The method of claim 9, wherein forming the second set of transistors in the Ge layer comprises bonding a Ge wafer to the Si substrate through a low temperature wafer bonding process, and subsequently thinning down the bonded Ge wafer in thickness.

14. The method of claim 9, wherein forming the third set of transistors in the oxide semiconductor layer comprises depositing the oxide semiconductor layer on top of the Ge layer through a low temperature physical vapor deposition (LTPVD) process or a low temperature chemical vapor deposition (LTCVD) process, wherein the oxide semiconductor layer is either an indium tin oxide (ITO) layer or an indium gallium zinc oxide (IGZO) layer.

15. The method of claim 9, further comprising forming one or more analog devices, input/output (I/O) devices, or peripheral devices in the Ge layer or the oxide semiconductor layer.

16. A semiconductor device comprising:
a silicon (Si) substrate containing a set of short channel (SC) transistors;
a germanium (Ge) layer on top of the Si substrate containing a set of p-type long channel (LC) transistors; and
an oxide semiconductor layer on top of the Ge layer containing a set of n-type LC transistors.

17. The semiconductor device of claim 16, further comprising a set of back-end-of-line (BEOL) layers above the oxide semiconductor layer providing interconnect between the set of p-type LC transistors and the set of n-type LC transistors, and a set of far-back-end-of-line (FBEOL) layers providing interconnect among the set of SC transistors, the set of p-type LC transistors, and the set of n-type LC transistors.

18. The semiconductor device of claim 17, where the oxide semiconductor layer is either an indium tin oxide (ITO) layer or an indium gallium zinc oxide (IGZO) layer.

* * * * *